United States Patent
Preuss et al.

(10) Patent No.: US 10,388,551 B2
(45) Date of Patent: Aug. 20, 2019

(54) DETECTION CIRCUIT, ELECTROSTATIC HOLDING DEVICE AND METHOD FOR DETECTING A COMPONENT ON AN ELECTROSTATIC HOLDING DEVICE

(71) Applicant: Berliner Glas KGaA Herbert Kubatz GmbH & Co., Berlin (DE)

(72) Inventors: Peter Preuss, Gosen-Neu Zittau (DE); Gunnar Heinze, Luebbenau (DE); Michael Fall, Berlin (DE); Alexander Stein, Berlin (DE)

(73) Assignee: BERLINER GLAS KGAA HERBERT KUBATZ GMBH & CO., Berlin (DE)

( * ) Notice: Subject to any disclaimer, the term of this patent is extended or adjusted under 35 U.S.C. 154(b) by 31 days.

(21) Appl. No.: 15/430,427

(22) Filed: Feb. 10, 2017

(65) Prior Publication Data

US 2017/0236736 A1    Aug. 17, 2017

(30) Foreign Application Priority Data

Feb. 17, 2016    (DE) .................. 10 2016 001 865

(51) Int. Cl.
*H02N 13/00* (2006.01)
*H01L 21/67* (2006.01)
(Continued)

(52) U.S. Cl.
CPC ......... *H01L 21/67259* (2013.01); *G01D 5/24* (2013.01); *G01R 27/26* (2013.01);
(Continued)

(58) Field of Classification Search
CPC ......... H02N 13/00; H01L 21/67; H01L 21/68; G01D 5/24; G01D 5/25; G01D 5/16;
(Continued)

(56) References Cited

U.S. PATENT DOCUMENTS

| 6,075,375 A | 6/2000 | Burkhart et al. |
| 2002/0008954 A1 | 1/2002 | Leeser |

(Continued)

*Primary Examiner* — Neel D Shah
(74) *Attorney, Agent, or Firm* — Caesar Rivise, PC

(57) ABSTRACT

Detection circuit for detecting electrical capacitance of electrode device in electrostatic holding device with clamp carrier, particularly for detecting component held by holding device, includes phase control circuit couplable to electrode device and has reference oscillator device, phase comparator and VCO circuit (VCOC). Phase comparator is arranged to generate a control voltage of VCOC as a function of reference signal from reference oscillator device and of VCO feedback signal from VCOC, at least one phase control circuit is configured for controlling VCOC as a function of capacitance to be detected, and for outputting an output signal characteristic of capacitance based on control voltage of VCOC, phase control circuit is configured for connection to electrode device such that VCOC contains capacitance to be detected as frequency-determining component, and reference oscillator device is configured for generating reference signal with adjustable reference frequency. Electrostatic holding device includes at least one such detection circuit.

17 Claims, 3 Drawing Sheets

(51) Int. Cl.
  *H01L 21/68*    (2006.01)
  *G01D 5/25*     (2006.01)
  *G08B 13/26*    (2006.01)
  *G01D 5/24*     (2006.01)
  *H01L 21/683*   (2006.01)
  *H03B 5/08*     (2006.01)
  *H03L 7/099*    (2006.01)
  *G01R 27/26*    (2006.01)
  *H03L 7/08*     (2006.01)

(52) U.S. Cl.
  CPC ........... *H01L 21/6833* (2013.01); *H03B 5/08* (2013.01); *H03L 7/0805* (2013.01); *H03L 7/099* (2013.01)

(58) Field of Classification Search
  CPC ........ G08B 13/26; G01R 27/26; G01R 27/08; G05F 1/00; G05F 1/56; G05F 1/565; G05F 1/575; G05F 1/571; G05F 1/573; H03K 5/13; H03K 5/04; H03B 1/00
  See application file for complete search history.

(56) References Cited

U.S. PATENT DOCUMENTS

| | | | |
|---|---|---|---|
| 2002/0175814 A1* | 11/2002 | Wadlow | G08B 13/26 340/562 |
| 2006/0285255 A1* | 12/2006 | Kawakubo | B81B 3/0021 360/294 |
| 2016/0337753 A1* | 11/2016 | Akino | H04R 31/00 |

\* cited by examiner

DETECTION CIRCUIT, ELECTROSTATIC HOLDING DEVICE AND METHOD FOR DETECTING A COMPONENT ON AN ELECTROSTATIC HOLDING DEVICE

CROSS REFERENCE TO RELATED APPLICATIONS

This application claims the benefit of DE 10 2016 001 865.8, filed Feb. 17, 2016, which is incorporated herein by reference in its entirety.

BACKGROUND OF THE INVENTION

The present invention relates to a detection circuit which is configured for detecting an electrical capacitance of an electrode device in an electrostatic holding device with a clamp carrier, in particular for detecting a component held by the electrostatic holding device. The invention furthermore concerns an electrostatic holding device provided with the detection circuit, and a method for detecting the electrical capacitance of an electrode device in an electrostatic holding device using the detection circuit. Applications of the invention lie in the operation of electrostatic holding devices.

Holding devices for electrostatic holding of components, also known as electrostatic holding devices, electrostatic clamping devices, electrostatic clamps, electrostatic chucks or ESC's, are generally known. One important application of electrostatic holding apparatus is in holding semiconductor wafers, in particular silicon wafers, in lithographic semiconductor processing, for example in chip production. Particular advantages are the easy switchability of electrostatic holding forces, a high positioning accuracy and a reliable fixing of the components in vacuum.

An electrostatic holding apparatus has a clamp carrier with at least one free surface for receiving the component, and an electrode device integrated in the clamp carrier with at least one pair of clamp electrodes (holding electrodes). The electrostatic holding forces are generated when the clamp electrodes are subjected to a high voltage and the clamp carrier is correspondingly electrically charged. The charged clamp carrier attracts the component so that this adheres to the free surface of the clamp carrier (so-called "clamped state") and can be held and/or moved with this. To release the component, the clamp carrier is discharged and optionally recharged, i.e. charged with reversed polarity (so-called "declamping").

By means of capacitance measurement at the clamp electrodes, or additional measurement electrodes of the electrode device, it can be detected whether, and if so where, a component is located on the clamp carrier, and whether the component is in the clamped state. For example, US 2002/0008954 A1 proposes coupling the electrical capacitance provided by the clamp electrodes at high voltage potential, via blocking condensers, to an oscillator at low voltage potential. If the capacitance of the clamp electrodes changes when the component is placed in position, the oscillator is measurably detuned. This technique however disadvantageously requires a capacitance of the blocking condensers which is 10 times higher than the capacitance of the clamp electrodes, whereby detection of small capacitance changes is hindered.

According to U.S. Pat. No. 6,075,375 A, measurement electrodes, which additionally are mounted on the clamp carrier next to the clamp electrodes, are connected to a capacitance detection circuit which contains a reference oscillator and a phase control circuit (PLL circuit) with a comparator and a voltage-controlled oscillator (VCO). The comparator compares the frequencies of the reference oscillator and the VCO, wherein the comparator output signal is fed back to the VCO as a control voltage. The capacitance presented by the measurement electrodes is connected to the reference oscillator which is detuned when the component is placed on the clamp carrier. The modified frequency influences the control voltage at the VCO which is analyzed as a measure of the capacitance to be detected.

The technique according to U.S. Pat. No. 6,075,375 A has the disadvantage that each PLL circuit has a specific capture range (so-called locked state of the VCO) which is determined by the capacitance to be detected. In practice however, different capacitance ranges are detected in different operating phases of the holding device. For example, when a wafer is placed on the clamp carrier, capacitance changes in the range of a few nF occur, while transition to the clamped state leads to capacitance changes in the range of only ¹⁄₁₀ nF. Furthermore, the value of the capacitance to be detected is dependent on the material and size of the component to be detected. As a result, the conventional detection circuit may leave the locked state of the VCO and give a false result. To avoid this problem, in the conventional technology it is necessary to adapt the circuitry of the capacitance detection circuit to suit the task in hand and the respective application conditions.

The technique used in U.S. Pat. No. 6,075,375 A furthermore has the disadvantage that the capacitance is measured at the measurement electrodes. These require a special surface on the clamp carrier which restricts the function of the clamp carrier. Furthermore, no information on the state of the component is obtained directly at the clamp electrodes.

Further systems are known in practice in which the capacitance to be detected is loaded with an alternating voltage, and the signal current resulting from phase-selective rectification at the capacitance is analyzed. These techniques however are imprecise, in particular for materials with low conductivity.

The objective of the invention is to provide an improved detection circuit and/or an improved method for detecting an electrical capacitance, in particular a capacitance change, of an electrode device in an electrostatic holding device with a clamp carrier, in particular for detecting a component held by the electrostatic holding device, in which disadvantages of conventional detection circuits are avoided and which is distinguished in particular by a wider area of application, a lower dependence on the value of the capacitance to be detected, a simplified adaptation to different application conditions, and/or an increased measurement precision. The objective of the invention is furthermore to provide an improved electrostatic holding device with which disadvantages of conventional holding devices are avoided and which is distinguished in particular by increased reliability in the detection of a component in various operating phases of the holding device.

These objectives are achieved by a detection circuit, an electrostatic holding device and/or a method of the invention.

SUMMARY OF THE INVENTION

According to a first general aspect of the invention, the above objective is achieved by a detection circuit with which an electrical capacitance of an electrode device in an electrostatic holding device, in particular a change in the capacitance, can be detected. The capacitance formed by the electrode device has an amount which depends on the presence and state of a component on the holding device and which is referred to below the capacitance or capacitance value.

The detection circuit is configured to connecting to the electrode device and to output an output quantity, in particular an output voltage, which is characteristic of the amount of the capacitance formed by the electrode device, in particular its at least two clamp electrodes and/or their measurement electrodes. Since the capacitance to be detected depends on the presence and where applicable the clamped state of a component on a clamp carrier of the electrostatic holding device, the output quantity, in particular its change in various operating phases of the holding device, provides information on the component (detection of the component held by the electrostatic holding device). Detection of a component comprises in particular the output of the output quantity which is characteristic of the presence or absence of the component and/or of the clamped state or declamped state of the component.

The detection circuit comprises at least one phase control circuit which can be coupled to the electrode device and comprises a reference oscillator device, a phase comparator and a voltage-controlled oscillator circuit (VCO circuit). The phase comparator is configured for generate a control voltage input to the VCO circuit as a function of a deviation between a reference signal from the reference oscillator device and a VCO feedback signal from the VCO circuit. The at least one phase control circuit is configured to control the VCO circuit as a function of the capacitance to be detected and to output the output quantity (in particular an output voltage) characteristic of the capacitance, based on the control voltage of the VCO circuit.

According to the invention, the phase control circuit is configured for a connection to the electrode device such that the VCO circuit contains the capacitance to be detected as a frequency-determining component. Deviating from the conventional technique, the capacitance to be detected is not coupled to the reference oscillator, but to the VCO circuit. The VCO circuit is configured such that, instead of a fixed value capacitance internal to the circuit, it contains the capacitance to be detected as an oscillator component. The function of the phase control circuit is to perform, with the phase comparator, a comparison between a reference frequency of the reference signal and the VCO frequency. Differences in the frequency and phase position are converted by the phase comparator into a comparator output signal (preferably a pulsed signal), the effective value of which corresponds to the error (difference) of the frequencies and phase positions. A direct voltage corresponding to the error, which is generated by optionally smoothing the pulses with a low-pass filter downstream of the phase comparator, is entered into the VCO circuit as the control voltage (input parameter) and changes the phase state and frequency of the VCO circuit until the frequencies and phase positions are matched. The detuning is thus eliminated by the variable capacitance to be detected in the VCO circuit. As a result, the control voltage for eliminating the detuning is a measure of the capacitance to be measured, while the reference frequency of the reference oscillator device—in contrast to conventional technology—is a fixed parameter which is not influenced directly by the capacitance to be detected, but can be adjusted as follows to provide the locked state of the phase control circuit.

According to the invention, the reference oscillator device is configured for generating the reference signal with an adjustable reference frequency. The reference frequency of the reference signal of the reference oscillator device can be set to a fixed selectable value. The adjustment may be performed hardware-based, e. g. with switches, or software-based, with a processor. Advantageously, this substantially simplifies the mutual adaptation of the reference frequency and the VCO frequency of the VCO feedback signal of the VCO circuit such that the VCO circuit is in the locked state.

According to a second general aspect of the invention, the above objective is achieved by an electrostatic holding device for holding a component, preferably a wafer, with electrostatic holding forces, which comprises a clamp carrier for holding the component, an electrode device with at least one pair of clamp electrodes configured for generating the electrostatic holding forces, and at least one detection circuit according to the first general aspect which is coupled to the electrode device.

According to a third general aspect of the invention, the above objective is achieved by a method for detecting a component which is held by an electrostatic holding device according to the second general aspect of the invention, with at least one detection circuit according to the first general aspect of the invention, wherein the output quantity of the phase control circuit characteristic of the capacitance is output and analyzed to detect the placing and/or a clamped state of the component on the electrostatic holding device.

One important advantage of the invention is in particular that, in contrast to the conventional technology, it is possible to use the comparator output signal of the phase comparator to determine whether the phase control circuit is engaged (locked), and to adapt the detection circuit with little complexity to differently sized amounts of the capacitance to be detected. When the system is locked, measurement of the comparator output signal, in particular of a direct voltage representing this, gives a valid result in relation to the fixed reference frequency offered. When the system is not locked, the detection circuit according to the invention can be used to change the fixed reference frequency such that the phase control circuit engages. The information on the present reference frequency, the information on the engaged state (locked state) of the phase control circuit, and the information on the control voltage at the VCO circuit, make it possible to detect capacitances and their changes over a wide range and in particular to determine small changes in capacitance with high resolution.

Preferably, the comparator output signal is subjected to a low-pass filtering to generate the direct voltage (control voltage of the VCO circuit). The direct voltage can be used in analogue signal form or be digitized by an analogue-digital converter to determine the state of the electrostatic holding device (placing of component, clamping of component) and to detect the locked state of the phase control circuit.

According to a preferred embodiment of the invention, the reference oscillator device comprises a reference oscillator and an oscillator processor. The reference oscillator has an output signal with a fixed base frequency. The oscillator processor is configured to output the reference signal for the phase control circuit and to set the reference frequency based on the output signal from the reference oscillator. The base frequency is preferably selected such that it is greater than or equal to the highest frequency which is required as a reference frequency on use of the detection circuit for the locked state of the phase control circuit. The base frequency is preferably selected in the range from 20 kHz to 20 MHz. Preferably, the oscillator processor contains a frequency splitter to provide the reference frequency based on the base frequency. Alternatively, another lower base frequency may be selected and the oscillator processor may generate the reference frequency with a frequency multiplier.

Advantageously, using the oscillator processor, different reference frequencies can be set during a preparatory training measurement ("teach in process") in order to adapt the detection circuit to various capacitances to be detected, in particular materials (conductivities) of held components, and to detect preferred reference frequencies for the various materials.

If, according to a further preferred embodiment of the invention, the oscillator processor is coupled to the phase comparator and configured for calculating the reference frequency as a function of a comparator output signal from the phase comparator, advantages result for a simple software-based adaptation of the detection circuit to various capacitances to be detected.

Furthermore, the oscillator processor may also be used to determine the state of the electrostatic holding device and detect the locked state of the phase control circuit. Alternatively, an additional processor, e.g. in a separate control device, or a separate circuit may be provided for these functions. The separate circuit may be constructed with logic circuits which are configured for analysis of the comparator output signal or the analogue or digital signals obtained therefrom, in order to determine the state of the electrostatic holding device and to detect the locked state of the phase control circuit.

Preferably, the reference frequency of the reference oscillator device is set as a function of a comparator output signal of the phase comparator, such that the VCO circuit is operated in a capture range of the phase control circuit. For example, the reference frequency of the reference oscillator device in a first operating phase may be set to detect the placing of the component on the electrostatic holding device, and in a second operating phase—if the placing of the component on the electrostatic holding device has been detected—to detect the clamped state of the component on the electrostatic holding device.

Advantageously, there are various possibilities for providing the capacitance to be detected using electrodes of the electrode device. According to a first variant, measurement electrodes of the electrode device, e.g. at the edge or in the middle of the clamp carrier, may be coupled to the VCO circuit. According to further variants, alternatively or additionally, the clamp electrodes of the electrode device which are provided to generate the electrostatic holding forces, may be coupled to the VCO circuit.

According to a further advantageous embodiment of the invention, the phase control circuit is configured for operation at a lower voltage potential than the electrode device.

Whereas the electrode device of the clamp carrier is loaded with a high voltage (direct voltage), e.g. in the range from 0.5 kV to 10 kV, the phase control circuit has a low voltage potential, e.g. in the range from 3 V to 5 V. In this case, the VCO circuit is configured to be coupled to the electrode device via blocking condensers. The blocking condensers capacitatively separate the phase control circuit from the high voltage of the electrode device. Advantageously, in this case the signal analysis in the phase control circuit and the output of the output quantity of the phase control circuit on low voltage potential are simplified. Because of the function method of the phase control circuit which is modified in comparison with conventional technique, the capacitance of the blocking condensers is not critical even for detection of small capacitance changes. Particularly preferably, a protection circuit is provided e.g. based on varistors, which is configured for protect the phase control circuit from voltage peaks.

According to an alternative advantageous embodiment of the invention, at least part of the phase control circuit, in particular the VCO circuit, is configured for operation on the same voltage potential as the electrode device. In this case, the electrode device and a voltage source for loading the electrode device with a clamp voltage (high voltage) can be coupled to the VCO circuit at high voltage potential. Advantageously, in this case, the circuit complexity is reduced in that the blocking condensers and protection circuit may be omitted.

According to a particularly preferred variant, only the VCO circuit is designed for operation at high voltage potential and is galvanically separated from the other components of the phase control circuit. According to an alternative variant, the entire phase control circuit may be configured for operation at the same voltage potential as the electrode device. Advantageously, these embodiments of the invention allow at least the VCO circuit, preferably however the entire detection circuit, to be operated at high voltage potential and be arranged as part of the clamp carrier.

According to further advantageous features of the electrostatic holding device, the voltage source for generating the clamp voltage may be connected to the electrode device and to the VCO circuit via inductances or gyrator circuits. Advantageously, thus the clamp electrodes for the alternating current voltage are decoupled from the voltage source, and voltage peaks at the electrode device and VCO circuit are suppressed. Furthermore, it is possible to integrate the voltage source on the clamp carrier.

If the electrode device of the electrostatic holding device according to the invention comprises several pairs of clamp electrodes, according to a further embodiment of the invention, several detection circuits may be provided wherein each of the detection circuits is coupled to a pair of clamp electrodes. Advantageously, the detection circuits provide not only detection of the component but also information on the position of the component relative to the pairs of clamp electrodes, and hence on the position of the component on the clamp carrier.

BRIEF DESCRIPTION OF THE DRAWINGS

Further details and advantages of the invention are described below with reference to the enclosed drawings. These show in.

DETAILED DESCRIPTION OF PREFERRED EMBODIMENTS

Features of preferred embodiments of the invention are described below with reference to the electrical configuration of the detection circuit in conjunction with an electrostatic holding device. Details of the electrostatic holding device, in particular the mechanical and geometric structure of the clamp carrier and the embedding of the electrode device in the clamp carrier, and its operation, in particular the reception, movement and deposit of components, in particular semiconductor wafers, are not described since these are known from the prior art. The clamp carrier may in particular have receiving surfaces which are flat on one or both sides and each of which is provided to receive a component. Although the invention is described with reference to the holding of semiconductor wafers as an example, the use of the invention is not restricted to the holding of wafers but it may also be used with other components.

Figure 1:
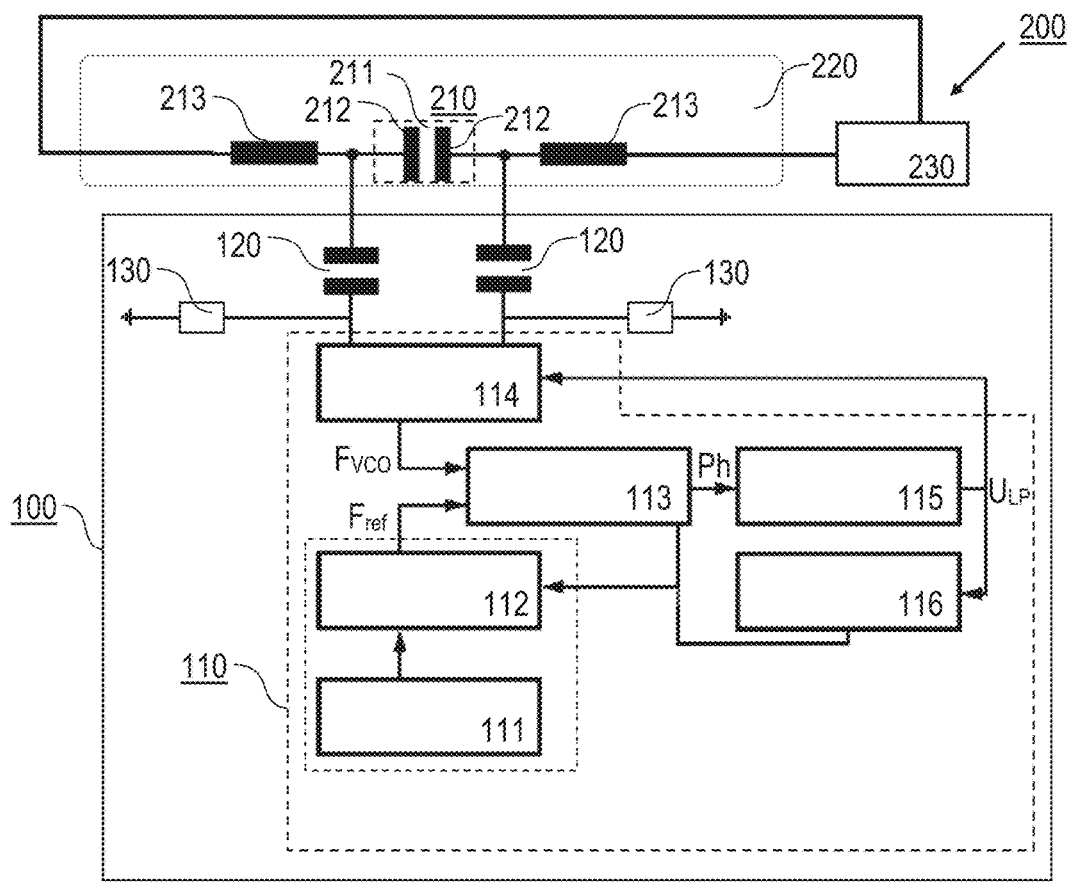
FIG. 1: a block diagram of features of a first embodiment of the detection device and the electrostatic holding device according to the invention.
Figure 2:
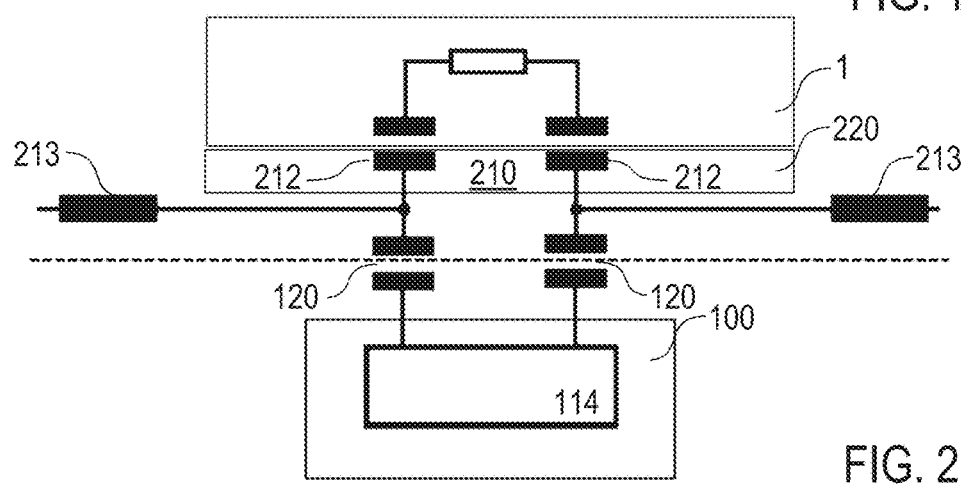
FIG. 2: a further illustration of the embodiment according to FIG. 1 showing a wafer.

FIGS. 1 and 2 show schematically features of a first embodiment of the invention with the electrostatic holding device 200, comprising an electrode device 210, a clamp carrier 220 and a voltage source 230, and the detection circuit 100. The first embodiment of the invention is distinguished in that the phase control circuit 110 of the detection circuit 100 is capacitatively separated from the electrode device 210 by means of blocking condensers 120, and is operated at low voltage potential. Real condensers have an extremely high resistance to direct voltage and are therefore able to separate direct voltage.

The electrode device 210 embedded in the clamp carrier 220 comprises at least two clamp electrodes 212 (shown as condenser plates) which provide the capacitance 211 to be detected and are connected to the voltage source 230 via inductances 213. The inductances 213 serve to supply the charge current to the electrode device 210. They are selected such that no resonance arises in cooperation with the capacitance 211, and their value amounts for example to 10 mH to 100 mH. The inductances 213 constitute chokes which decouple the clamp electrodes for alternating current voltage from the voltage source 230 and block undesirable voltage peaks from the voltage source 230. The voltage source 230 is configured to generate a high voltage. The voltage applied at the clamp electrodes of the electrode device 210 is for example+/−3000 V.

The detection circuit 100 is configured to detect the capacitance change in both operating phases of placing of the wafer 1 on the clamp carrier 220 and of transition into the clamped state, and hence to detect the state of the wafer 1. The capacitance 211 when the clamp carrier 220 is empty amounts for example to 600 pF, and when the clamp carrier 220 is occupied by a wafer 1 (see FIG. 2) it amounts for example to 3 nF. If, when the electrode device 210 is loaded with a high voltage, the wafer 1 is drawn against the surface of the clamp carrier 220, the capacitance 211 increases for example by 100 pF.

The detection circuit 100 comprises the phase control circuit 110, the blocking condensers 120 and the protection circuit 130. The blocking condensers 120 form a series circuit with the capacitance 211 to be detected of the electrode device 210, wherein the blocking condensers 120 are arranged for potential separation of the phase control circuit 110 from the electrode device 210. The blocking condensers 120 for example have a capacitance of 680 pF. The protection circuit 130 comprises two varistors which are switched conductively when voltage peaks occur at the blocking condensers 120 against ground potential. For example, 6V varistors are used which form a short-circuit to ground potential on voltage peaks above a voltage of 6 V.

The phase control circuit 110 comprises a reference oscillator device with a reference oscillator 111 and an oscillator processor 112, a phase comparator 113, a VCO circuit 114, a low-pass filter 115 and an analogue-digital converter 116.

The reference oscillator 111 comprises for example a quartz oscillation circuit, the output signal of which has a base frequency of for example 8 MHz. The output signal is processed by the oscillator processor 112 for output of the reference signal with the reference frequency $F_{ref}$. For this, the oscillator processor 112 contains for example a frequency splitter which is controlled as a function of a locked state signal derived from the comparator output signal. Further information on the situation of the detection range of the phase control circuit is given for example by the analogue-digital converter 116.

The VCO circuit 114 is a voltage-controlled oscillator, wherein the frequency-determining component of which is provided by the capacitance 211 of the electrode device 210. For this, the blocking condensers 120 are connected to the VCO circuit 114. The VCO circuit 114 gives a VCO feedback signal with a VCO frequency $F_{VCO}$. The VCO feedback signal with the VCO frequency $F_{VCO}$ and the reference signal with the reference frequency $F_{ref}$ are applied at the inputs to the phase comparator 113, the comparator output signal Ph from which is characteristic for the phase error between the two frequencies $F_{VCO}$ and $F_{ref}$. The low-pass filter 115 delivers a direct voltage $U_{LP}$ based on the phase error Ph, which voltage is characteristic of the phase error and is given as an input parameter firstly to the VCO circuit 114 and secondly to the analogue-digital converter 116. For the VCO circuit 114, the direct voltage $U_{LP}$ serves as a control voltage for tracking the VCO frequency. In locked state, the direct voltage $U_{LP}$ also gives the desired information on the capacitance 211 to be detected, or on the state of the wafer 1 to be detected. The analogue-digital converter 116 provides information on the locked state of the phase control circuit 110 which is used to control the oscillator processor 112.

The locked state of the phase control circuit 110 is detected so as to check whether the direct voltage $U_{LP}$ lies in the middle of a predefined detection range, and corresponds for example to half the operating voltage of the VCO circuit 114. This test may be carried out software-based with the oscillator processor 112. If said condition is not fulfilled, the reference frequency $F_{ref}$ is changed using the oscillator processor 112 until the locked state is detected (e.g. detection of a locked signal with oscillator processor 112).

The series connection of the capacitance 211 to be detected and the blocking condensers 120 forms a total capacitance $C_{RF}$ which determines the frequency of the VCO circuit 114. The capacitance $C_{RF}$ is calculated as follows:

$$C_{RF}=[C_A^{-1}+C_B^{-1}+(C_{211}+\Delta C_{211})^{-1}]^{-1},$$

wherein $C_A$ and $C_B$ are the capacitances of the blocking condensers 120, and $C_{211}$ is the capacitance value of the capacitance 211 to be detected.

Detection of the capacitance gives a linear dependency of the direct voltage $U_{LP}$ on the capacitance $C_{RF}$ in the VCO circuit 114 when the phase control circuit 110 is in the locked state. The linear dependency may be used both to detect the locked state and to determine the amount of the capacitance 211 to be detected.

One advantage of the first embodiment of the invention according to FIGS. 1 and 2 is that, irrespective of the interposition of the blocking condensers 120 and the resulting slight changes in $C_{RF}$ in the pF range on placing or clamping of the wafer 1, the change in the capacitance 211 to be detected can be detected reliably and reproducibly. The direct voltage $U_{LP}$ may be used as a direct measure of the change in the capacitance 211 to be detected.

The value of the voltage $U_{LP}$ is provided as information to an external device for signal analysis, in particular an external control device, in order to detect whether the wafer 1 is placed on the clamp carrier 220 and the high voltage can be switched on, and whether, after switching on the high voltage, the wafer 1 is in the clamped state. If the clamped state has been detected, the electrostatic holding device 200 may be operated, e.g. the wafer 1 may be moved to a station in a processing line for semiconductor processing. Alternatively, these steps may be performed by the oscillator processor 112.

The diagrammatic depiction of the first embodiment of the invention in FIG. 2 illustrates the separation into a high-voltage region and a low-voltage region by the blocking condensers 120 (see dotted line). The high voltage is applied by the voltage source 230 (see FIG. 1) to the electrode device 210 via the inductances 213. For example, the electrode device 210 comprises two clamp electrodes 212 which each extend over half the surface of the clamp carrier 220 and are each illustrated by a condenser plate. When the wafer 1 is placed on the clamp carrier 220, the capacitance of the electrode device 210 is influenced by the material of the wafer 1, in particular its electrical conductivity, as illustrated in FIG. 2. On the low-voltage side, the detection circuit 100 is arranged in particular with the VCO circuit 114 which is not influenced by the high voltage at the electrode device 210.

Figure 4:
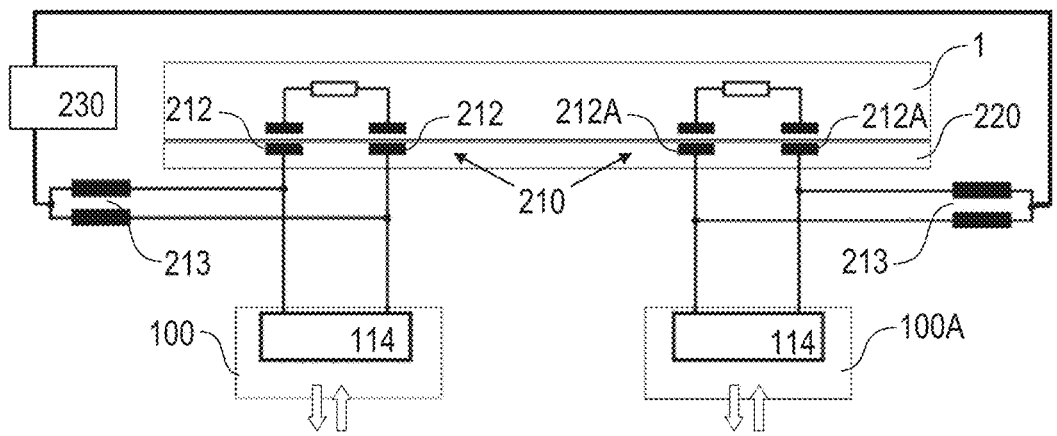
FIG. 4: a further illustration of the embodiment according to FIG. 3 showing a wafer.

The first embodiment of the invention according to FIGS. 1 and 2 can be modified so that several pairs of clamp electrodes are provided on the clamp carrier 220, each of which is connected to a detection circuit (see FIG. 4).

Figure 3:
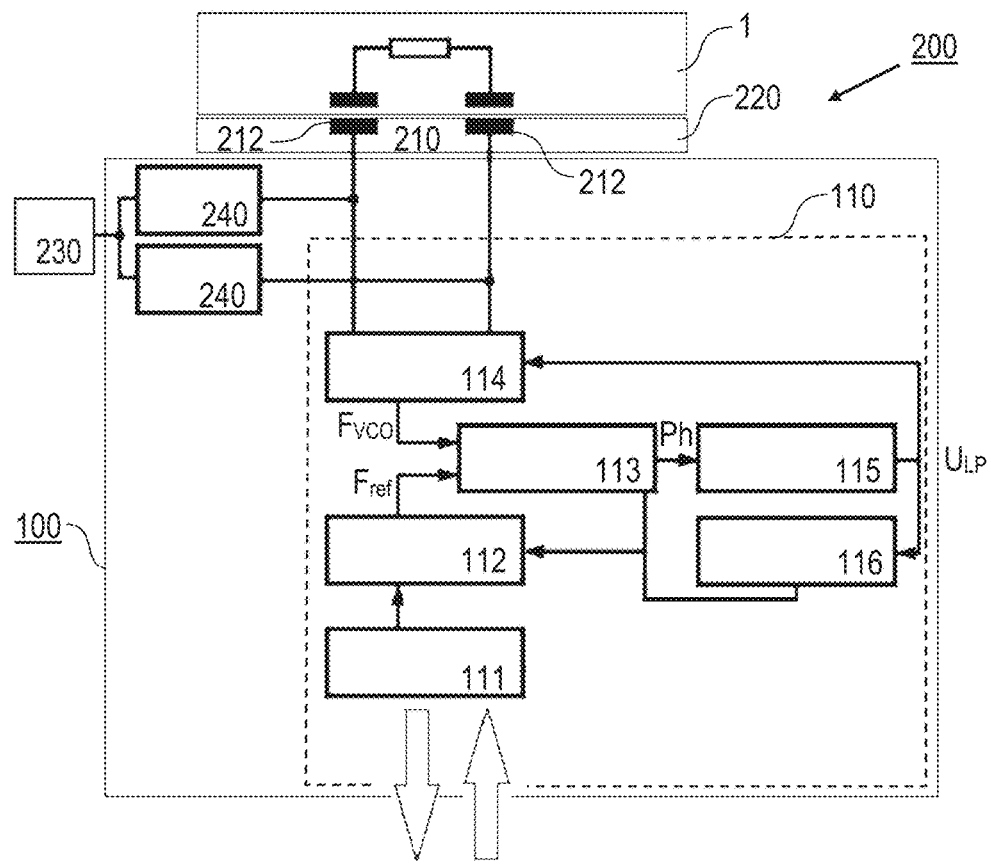
FIG. 3: a block diagram of features of a second embodiment of the detection device and the electrostatic holding device according to the invention.

FIGS. 3 and 4 illustrate schematically a second embodiment of the invention in which at least the VCO circuit 114 is operated at the high voltage potential of the electrode device 210. According to FIG. 3, it is possible here to operate the entire phase control circuit 110 at high voltage potential and separate this galvanically from the further signal analysis (see double arrows). Alternatively it is possible, according to FIG. 4, to operate only the VCO circuit 114 at high voltage potential and separate this galvanically from the other components of the phase control circuit (see double arrows). The galvanic separation of the detection circuit 100 from a device for further signal analysis, e.g. a further control device for signal analysis and control of the electrostatic holding device 200 (not shown), or the VCO circuit 114 from the other components, is achieved for example using an opto-coupler with a signal transmission based on infrared radiation, or with a wireless radio interface.

According to FIG. 3, the electrostatic holding device 200 comprises the clamp carrier 220 with the electrode device 210 and the voltage source 230, and the detection circuit 100 with the phase control circuit 110. The clamp carrier 220 is configured for receiving a component to be detected, in particular a wafer 1.

By deviation from the first embodiment according to FIG. 1, the VCO circuit 114 is connected directly to the clamp electrodes 212 of the electrode device 210 without capacitative separation. The high voltage source 230 is connected to the clamp electrodes 212 and the VCO circuit 114 via two gyrator circuits 240. The use of gyrator circuits 240 compared with the inductances 213 according to FIG. 1 has the advantage that for each pair of clamp electrodes, only one integratable, miniaturizable circuit is provided, which allows integration together with the voltage source 230 on the electrostatic holding device 200, in particular on the clamp carrier 220.

Furthermore, if the entire detection circuit 100 is laid to high voltage potential, this can also be provided as an integral component of the clamp carrier 220. Here the phase control circuit 110 is operated as described above with reference to FIG. 1.

FIG. 4 illustrates an alternative variant of the second embodiment of the invention in which only the VCO circuit 114 is operated at high voltage potential and galvanically separated from the other components of the phase control circuit (see double arrow). FIG. 4 furthermore shows a variant in which two pairs of clamp electrodes 212, 212A are provided on the clamp carrier 220, each of which is coupled to a detection circuit 100, 100A according to the invention. The part electrodes of each pair of clamp electrodes 212, 212A are direct components of the capacitive measurement circuit, without blocking condensers being provided as in FIG. 1. This advantageously increases the sensitivity of detection with the detection circuit.

The part electrodes of each pair of clamp electrodes 212, 212A are each loaded with the same bipolar high voltage. For this, both clamp electrodes are connected via inductances 213 to the same high-voltage source 230. The inductances 213 prevent a short-circuit for alternating current voltage in the detection circuit 100 since they have a choke effect for voltage peaks.

Figure 5:
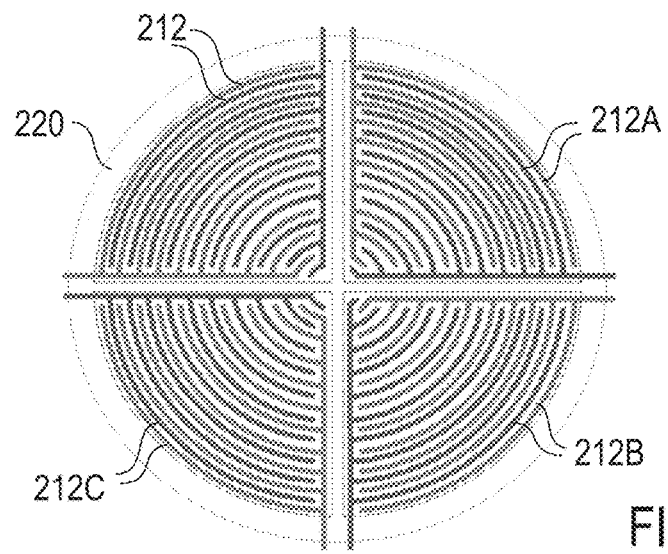
FIGS. 5 to 7: top views of different variants of electrode devices of the electrostatic holding device according to the invention.

FIG. 5 shows a further variant of the invention in which several clamp electrodes 212, 212A are provided on the clamp carrier 220. The area of the clamp carrier 220 is divided into four quadrants, each of which carries a pair of clamp electrodes 212, 212A, 212B, 212C. Each pair of clamp electrodes 212, 212A, 212B, 212C is connected to a detection circuit according to the invention (not shown) in order to detect the capacitance of the respective clamp electrodes 212, 212A, 212B, 212C. Advantageously, this allows a location-resolving detection of the wafer on the clamp carrier 220. By formation of a ratio of capacitance values, the position of the wafer on the clamp carrier 220 can be determined directly.

Figure 6:
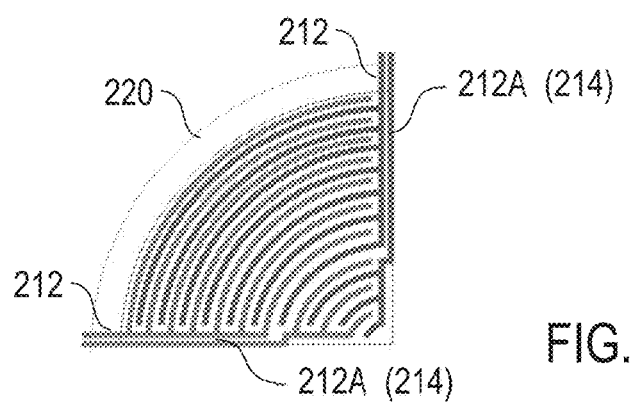

FIG. 6 shows a further example with several clamp electrodes, wherein two pairs of clamp electrodes 212, 212A are provided in each quadrant, and each connected to a detection circuit. This arrangement of electrodes advantageously has an increased sensitivity of detection for detecting the clamped state. One of the pairs of electrodes may constitute measurement electrodes 214 which are not connected to a voltage source for clamping the wafer.

Figure 7:
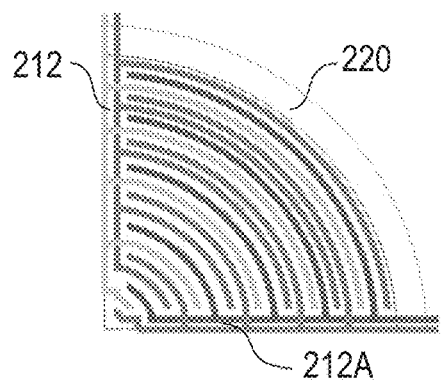

According to a further variant of an electrostatic holding device with several clamp electrodes 212, 212A, these are connected together in nested fashion as illustrated schematically in FIG. 7. Each pair of clamp electrodes 212, 212A is provided with its own detection circuit. This arrangement of electrodes is advantageously suitable in particular for clamping poorly conductive materials such as for example sapphire.

The features of the invention disclosed in the description above, the drawings and the claims may be important, both individually and in combination or sub-combination, for implementing the invention in its various embodiments.

What is claimed is:

1. A detection circuit which is configured for detecting an electrical capacitance of an electrode device in an electrostatic holding device with a clamp carrier, comprising at least one phase control circuit which can be coupled to the electrode device and which has a reference oscillator device, a phase comparator and a voltage-controlled oscillator circuit (VCO circuit), wherein the phase comparator is arranged for generating a control voltage of the VCO circuit in dependency on a reference signal from the reference oscillator device and on a VCO feedback signal from the VCO circuit, and the at least one phase control circuit is configured for controlling the VCO circuit in dependency on the capacitance to be detected, and for outputting an output signal characteristic of the capacitance based on the control voltage of the VCO circuit, wherein the at least one phase control circuit is configured for a connection to the electrode device such that the VCO circuit contains the capacitance to be detected as a frequency-determining component, the reference oscillator device is configured for generating the reference signal with an adjustable reference frequency, the reference oscillator device includes a reference oscillator and an oscillator processor, and the oscillator processor is configured for outputting the reference signal and for setting the adjustable reference frequency based on an output signal from the reference oscillator.

2. The detection circuit according to claim 1, wherein the oscillator processor is coupled to the phase comparator and is configured for calculating the reference frequency in dependency on a comparator output signal from the phase comparator.

3. The detection circuit according to claim 1, wherein the electrode device comprises measurement electrodes which can be coupled to the VCO circuit and indicate the capacitance contained in the VCO circuit when the detection circuit is coupled to the electrode device.

4. The detection circuit according to claim 1, wherein the electrode device comprises clamp electrodes for generating electrostatic holding forces, which can be coupled to the VCO circuit and determine the capacitance contained in the VCO circuit when the detection circuit is coupled to the electrode device.

5. The detection circuit according to claim 1, wherein
the VCO circuit can be coupled to the electrode device via blocking condensers, wherein the at least one phase control circuit is configured for operation at a lower voltage potential than the electrode device.

6. The detection circuit according to claim 5, wherein a protection circuit is provided which is configured for protecting the at least one phase control circuit against voltage peaks.

7. The detection circuit according to claim 1, wherein the electrode device and a voltage source can be coupled to the VCO circuit for loading the electrode device with a clamp voltage, such that the VCO circuit can be operated at the same voltage potential as the electrode device.

8. The detection circuit according to claim 7, wherein the VCO circuit is galvanically separated from other components of the at least one phase control circuit.

9. The detection circuit according to claim 7, wherein an entirety of the at least one phase control circuit is configured for operation on the same voltage potential as the electrode device.

10. The detection circuit according to claim 1, which is configured for detecting a component held by the electrostatic holding device.

11. An electrostatic holding device which is configured for holding a component by electrostatic holding forces, comprising
a clamp carrier which is configured to receive the component,
an electrode device with at least one pair of clamp electrodes configured for generating electrostatic holding forces, and
at least one detection circuit according to claim 1 which is coupled to the electrode device.

12. The electrostatic holding device according to claim 11, wherein the electrode device comprises several pairs of clamp electrodes and several detection circuits are provided, wherein each pair of clamp electrodes is coupled to one of the detection circuits, respectively.

13. The electrostatic holding device according to claim 11, wherein a voltage source is connected to the electrode device via inductances or gyrator circuits.

14. A method for detecting a component which is held by an electrostatic holding device according to claim 11, comprising the steps
(A) output of the output signal of the at least one phase control circuit which is characteristic of the capacitance, and
(B) analysis of the output signal with detection of at least one of a placing and a clamped state of the component on the electrostatic holding device.

15. The method according to claim 14, wherein the reference frequency of the reference oscillator device is set in dependency on an output signal from the phase comparator such that the VCO circuit is operated in a capture range of the at least one phase control circuit.

16. The method according to claim 15, wherein the reference frequency of the reference oscillator device in a first operating phase is set to detect the placing of the component on the electrostatic holding device, and in a second operating phase, if the placing of the component on the electrostatic holding device has been detected, to detect the clamped state of the component on the electrostatic holding device.

17. The method according to claim 15, wherein
the electrode device comprises several pairs of clamp electrodes and several detection circuits are provided, wherein each pair of clamp electrodes is coupled to one of the detection circuits, and
the analysis of the output signal from the detection circuits comprises detection of the position of the component on the clamp carrier.

* * * * *